(12) United States Patent
Bauer et al.

(10) Patent No.: US 7,589,403 B2
(45) Date of Patent: Sep. 15, 2009

(54) LEAD STRUCTURE FOR A SEMICONDUCTOR COMPONENT AND METHOD FOR PRODUCING THE SAME

(75) Inventors: Michael Bauer, Nittendorf (DE); Angela Kessler, Regensburg (DE); Wolfgang Schober, Amberg (DE); Alfred Haimerl, Sinzing (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 30 days.

(21) Appl. No.: 11/927,239

(22) Filed: Oct. 29, 2007

(65) Prior Publication Data

US 2008/0224301 A1 Sep. 18, 2008

Related U.S. Application Data

(63) Continuation of application No. PCT/DE2006/000722, filed on Apr. 25, 2006.

(30) Foreign Application Priority Data

Apr. 29, 2005 (DE) .................. 10 2005 020 453

(51) Int. Cl.
*H01L 23/495* (2006.01)
(52) U.S. Cl. .................. 257/676; 257/687; 977/938
(58) Field of Classification Search ........... 257/676, 257/687, 787, E23.11, E51.038, E51.04, 257/E23.074, E23.165; 977/938
See application file for complete search history.

(56) References Cited

U.S. PATENT DOCUMENTS

| 5,554,569 | A | 9/1996 | Ganesan et al. |
| 6,831,359 | B2 | 12/2004 | Heilbronner |
| 2003/0231471 | A1 | 12/2003 | De Lorenzo et al. |
| 2004/0206448 | A1 | 10/2004 | Dubrow |
| 2006/0017069 | A1 | 1/2006 | Bergmann et al. |
| 2006/0222852 | A1* | 10/2006 | Dubin et al. ............. 428/408 |
| 2007/0205518 | A1 | 9/2007 | Bauer et al. |
| 2007/0222472 | A1* | 9/2007 | Raravikar et al. ........ 324/765 |

FOREIGN PATENT DOCUMENTS

| DE | 10124047 A1 | 11/2002 |
| WO | 9712397 A1 | 4/1997 |
| WO | 9940812 A1 | 8/1999 |
| WO | 03096389 A2 | 11/2003 |
| WO | 2006050709 A1 | 5/2006 |

* cited by examiner

*Primary Examiner*—Theresa T Doan
(74) *Attorney, Agent, or Firm*—Edell, Shapiro & Finnan, LLC

(57) ABSTRACT

A lead structure for a semiconductor component includes: external leads for external connections outside a plastic housing composition, internal leads for electrical connections within the plastic housing composition, and a chip mounting island composed of the lead material. While leaving free contact pads of the internal leads, the top sides of the chip mounting island and the internal leads are equipped with nanotubes as an anchoring layer. The plastic housing composition is arranged in the interspaces between the nanotubes arranged on the internal leads, while an adhesive composition for the semiconductor chip is arranged in the interspaces between the nanotubes arranged on the chip mounting island. The adhesive composition and the plastic housing composition fill the interspaces in a manner free of voids.

10 Claims, 3 Drawing Sheets

LEAD STRUCTURE FOR A SEMICONDUCTOR COMPONENT AND METHOD FOR PRODUCING THE SAME

CROSS REFERENCE TO RELATED APPLICATIONS

This application is a continuation of PCT/DE2006/000722, filed on Apr. 25, 2006, entitled "Lead Structure for a Semiconductor Component and Method for the Production Thereof," which claims priority under 35 U.S.C. §119 to German Application No. DE 10 2005 020 453.8, filed on Apr. 29, 2005, entitled "Lead Structure for a Semiconductor Component and Method for the Production Thereof," the entire contents of which are hereby incorporated by reference.

BACKGROUND

Lead structures for semiconductor components are composed of a lead material and have external leads for external connections and internal leads for electrical connections within a plastic housing composition. Moreover, the lead structures have a chip mounting island composed of the lead material. In the case of surface-mounted semiconductor components, the lead structure comprises similar elements, but only surfaces of leads project from the plastic housing composition as external leads, while the internal areas which are surrounded by plastic housing composition are referred to as internal leads. In both cases, lead structures are involved since they arise with the aid of a leadframe from which the semiconductor components are stamped after completion.

One problem of these lead structures is that the surfaces of the internal leads have to enter into an intensive bonding with the plastic housing composition in order that the internal leads do not break out from the plastic housing composition. A further problem, which occurs at the chip mounting island, is that the top side of the chip mounting island has to be connected to a semiconductor chip, which is usually achieved by means of a conductive adhesive composition. In this case there is the risk of voids forming below the semiconductor chip in the adhesive composition, and of moisture reservoirs accumulating, which can lead to a delamination of the semiconductor chip from the chip mounting island by delamination of the boundary layer either between top side of the chip mounting island and adhesive layer or between adhesive layer and rear side of the semiconductor chip.

In order to improve lead structures of this type, the leadframe, in particular the chip mounting island and the top side of the internal leads, has hitherto been treated by a special deposition of rough coatings with the aid of a special plating or by roughening of the corresponding surfaces of the lead structure or by physicochemical methods, such as plasma etching, such that an intermeshing of the interfaces is achieved.

Even electrolytic coating with adhesion-improving layers based on inorganic and organometallic compounds does not exhibit the desired results. Likewise, the previous adhesion-improving measures such as plasma etching or deposition of inorganic or metallic compounds are extremely expensive and do not yield any significant improvement in the molding composition adhesion and the adhesion of the semiconductor chips on the chip mounting areas of the lead structure.

SUMMARY

Described herein are a lead structure for a semiconductor component and a method for producing the same. The lead structure includes: external leads for external connections outside a plastic housing composition, internal leads for electrical connections within the plastic housing composition, and a chip mounting island composed of the lead material. While leaving free contact pads of the internal leads, the top sides of the chip mounting island and the internal leads are equipped with nanotubes as an anchoring layer. The plastic housing composition is arranged in the interspaces between the nanotubes arranged on the internal leads, while an adhesive composition for the semiconductor chip is arranged in the interspaces between the nanotubes arranged on the chip mounting island. The adhesive composition and the plastic housing composition fill the interspaces in a manner free of voids.

BRIEF DESCRIPTION OF THE DRAWINGS

The lead structure and method for producing the same will now be described in more detail with reference to the accompanying figures, where.

DETAILED DESCRIPTION

Figure 1:
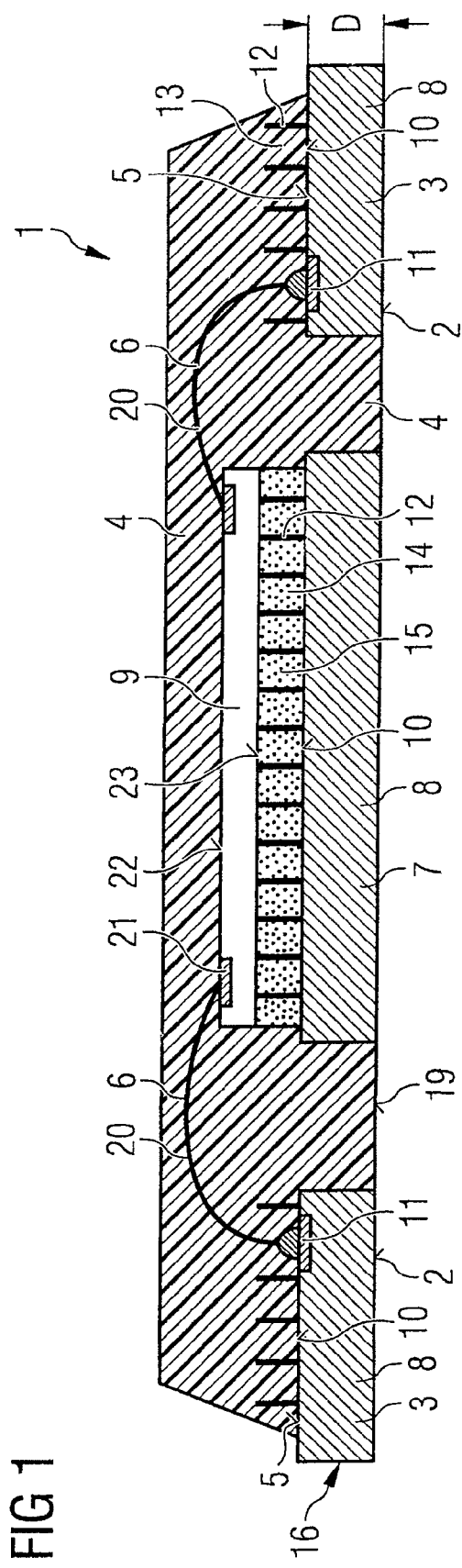
FIG. 1 shows a schematic cross section through a semiconductor component with lead structure in accordance with one embodiment.

Described herein is a lead structure and method for producing the same which enables an improved adhesion of encapsulating materials and an improved adhesion of the semiconductor chip or the adhesive composition on the chip mounting island. This is achieved via the subject matter of the independent claims. Advantageous developments of the lead structure and method are recited in the dependent claims.

The lead structure includes external leads for external connections outside a plastic housing composition and internal leads for electrical connections within the plastic housing composition. The lead structure furthermore comprises a chip mounting island composed of lead material for applying a semiconductor chip. Nanotubes are arranged on the top sides of the chip mounting island and of the internal leads while leaving free contact pads of the internal leads, the nanotubes being anchored on the top sides. The interspaces between the nanotubes are filled with plastic housing composition on the internal leads, and an adhesive composition is arranged in the interspaces between the nanotubes on the chip mounting island, wherein the adhesive composition and the plastic housing composition fill the interspaces in a manner free of voids.

This lead structure has the advantage that the adhesion properties or the intermeshing between plastic housing composition and top sides of the internal leads and also the intermeshing between the top side of the chip mounting island and the adhesive composition are significantly improved. This improvement is based on the properties of the nanotubes which enter into a close van der Waals linkage with the metallic surfaces. Furthermore the nanotubes are extremely flexible and can attain a length of up to a few millimeters in conjunction with a diameter of a few nanometers. For the application envisaged here on lead structures, however, an average length of the nanotubes of a few micrometers already suffices to achieve an improvement in the adhesion properties of the plastic housing composition or the adhesive composition on the lead structure.

The high tensile strength of nanotubes, which in the case of carbon nanotubes with a value of approximately $10^{11}$ Pa is orders of magnitude better than in the case of plastics, is also an improvement in this case. This reduces the risk of a delamination between the contact areas of the adhesive composition and the chip mounting island or between the plastic housing composition and the internal leads. Particularly in the event of high thermal loading on account of different coefficients of expansion of the materials involved, the high tensile strength of the nanotubes, in comparison with conventional constructions, brings about a higher tensile loading capacity and hence a greater shear strength of the adhesion-promoting layers. Since carbon nanotubes have no grain boundaries despite their length, their deformability and elasticity are significantly greater than in conventional materials, such that breaking up or microcracking at grain boundaries is practically impossible. Consequently, the adhesion-promoting nanotubes form flexurally strong deformable and elastic anchors which can form stable anchoring both in the plastic housing composition and in the adhesive composition and also at the metallic surfaces.

In one optional embodiment, the internal leads and the external leads and the chip mounting island have identical material thicknesses. This property results in principle from the lead technology or lead structure, in which both the internal leads and the chip mounting island are stamped from the same copper sheet that forms the leadframe. However, it is possible to reinforce the chip mounting island via corresponding cooling plates, such that the total material thickness of the chip mounting island can indeed deviate from the material thickness of the leads. This is not the case, however, for surface-mountable semiconductor components on a leadframe since the external side of the chip mounting island, which is not covered by the semiconductor chip or by plastic housing composition, simultaneously serves as a surface-mountable external connection.

In a further embodiment, the lead structure is multilayered and comprises, on a base structure composed of a copper alloy, metal layers of at least one of the metals nickel, iron, molybdenum, cobalt or alloys thereof. These metal layers have the advantage that they have metals which serve as a catalyst for forming carbon nanotubes. Consequently, a further layer on a metal layer of this type can have carbon nanotubes which have formed from seeds of carbon nanotubes. This two-layered layer on a lead structure composed of a metal layer composed of catalyst metal and a layer composed of carbon nanotubes has the advantage that it can closely intermesh with the interfaces of the plastic housing composition with the adhesive composition below the semiconductor chip.

The carbon nanotubes on the lead structure have a diameter d of the order of magnitude of nm, optionally between $1.2 \text{ nm} \leq d \leq 300 \text{ nm}$. It is this minimal diameter which causes the high flexibility of the carbon nanotubes. Furthermore, it is possible, in the structure according to an embodiment of the method, to apply carbon nanotubes on the lead structure with a proportion by volume of $\Delta V$ between $1\%$ by volume $\leq \Delta V \leq 10\%$ by volume remainder plastic housing composition or adhesive composition in the form of polymeric chain molecules. This layer composed of a mixture including carbon nanotubes and polymeric chain molecules of the plastic housing composition or adhesive composition involved produces a close linking of the two structures, thereby giving rise to an adhesion-improving effect in particular on the chip mounting island. As already mentioned above, the carbon nanotubes optionally have a length l of the order of magnitude of a few $50 \text{ nm} \leq l \leq 3 \text{ mm}$. However, an average length l of the carbon nanotubes of between $0.1 \, \mu\text{m} \leq l \leq 20 \, \mu\text{m}$ is advantageous for the application planned here. For the leadframe according to an embodiment, the carbon nanotubes on the lead structure can optionally be oriented orthogonally with respect to the surfaces and practically form a columnar structure.

Also described herein is a semiconductor component comprising a lead structure such as has been explained above. In this case, the lead structure is used as an adhesion-promoting component in the semiconductor component between internal leads and plastic housing composition between chip mounting island and adhesive layer for the semiconductor chip. A region for contact pads is kept free on the top side of the internal leads, however, in order to enable a cohesive metallic connection of bonding wires to the internal leads. In order to reliably ensure this, these regions of the top side of the internal leads are kept free of carbon nanotubes. However, it is desirable in comparison with the prior art for nanotubes likewise to be provided in the region of the conductive adhesive composition for the semiconductor chip, which nanotubes improve the adhesion of the semiconductor chips on the chip mounting island in interaction with the adhesive composition.

A method for the production of a lead structure comprises the following method steps. The first step involves producing a strip-type leadframe including a plurality of semiconductor component positions with external leads, internal leads and chip mounting runs. Afterward, nanotube seeds are selectively applied to surfaces of the chip mounting islands and of the internal leads while leaving free contact pads on the internal leads. Nanotubes arranged in columnar fashion are then grown on the nanotube seeds.

Catalyst layers that accelerate grown of nanotubes can also be applied instead of discrete nanotube seeds. This method has the advantage that the lead structure can be provided with an adhesion-improving structure on its top sides, in particular on the internal leads and the chip mounting island, with relatively low outlay. This method furthermore has the advantage that a close intermeshing can be effected between adhesive composition on the chip mounting island and the nanotubes already present or prepared there via the method.

When selectively applying nanotube seeds to the surfaces of the internal leads and of the chip mounting islands, the remaining surfaces of the leadframe can be covered with a protective layer in order to prevent the leadframe from being coated with nanotubes all around. As nanotube seeds, fullerenes are selectively deposited on the unprotected surfaces. The fullerenes are carbon atoms attached to one another in a ring-shaped manner, wherein in each ring six atoms are arranged in accordance with the so-called Kekülé ring and form a spherical surface. This spherical surface can be used as a seed cell for cylindrical nanotubes growing in columnar fashion.

In one optional implementation of the method, before selectively applying the nanotube seeds to the surfaces of the lead structure, a layer of catalyst material, optionally a layer comprising one of the metals nickel, iron, molybdenum, cobalt or alloys thereof, is applied. The advantages of the metal layers have already been discussed above, and will not be repeated.

Furthermore, it is also possible, for producing a layer with carbon nanotubes, to apply to the lead structure catalyst metal with a solution of carbon nanotube seeds and with oligomers of a synthetic resin. These can subsequently form carbon nanotubes and polymeric chain molecules with the synthetic resin via thermal treatment of the solution.

A method for the production of semiconductor components comprising a lead structure includes the following method steps. The first step involves producing a strip-type leadframe with a plurality of semiconductor component positions including external leads, internal leads and chip mounting islands. This is followed by selectively applying nanotube seeds to surfaces of the chip mounting islands and of the internal leads while leaving free contact pads on the internal leads. Nanotubes arranged in columnar fashion are then grown on the nanotube seeds. An adhesive composition is subsequently applied to the chip mounting island at the semiconductor component positions. Semiconductor chips are then arranged onto the adhesive composition on the chip mounting islands in the semiconductor component positions.

Finally, electrical connections between the semiconductor chips and the contact pads of the internal leads are produced. The semiconductor chips and the electrical connections and also the internal leads are then introduced into a plastic housing composition. In this case, the undersides of the chip mounting island and of the internal leads can serve as surface-mountable external contacts, the internal leads then being external leads as viewed from outside. In this case, embedding the semiconductor chips and the electrical connections into the plastic housing composition and applying the plastic housing composition to the surfaces of the internal leads are effected via dispensing technology or injection-molding technology.

To summarize, it can be established that according to the method, nanotubes are applied to a lead structure, this being done by selective growth on corresponding nanotube seeds. In this case, the nanotube seed density or the distance between the nanotube seeds is chosen such that the plastic housing composition or the adhesive composition can penetrate into the interspaces in a manner free of voids, thereby resulting in a significant enlargement of the wettable surface area and thus also in an improved adhesion of the plastic housing composition or the adhesive composition with the lead structure.

In the following paragraphs, examples of embodiments of the lead structure and method are described in connection with the figures.

FIG. 1 shows schematic cross section through a semiconductor component 1 with lead structure 16 in accordance with one embodiment. The semiconductor component 1 is based on the lead structure 16 as a circuit carrier, wherein the lead structure 16 includes a chip mounting island 7 and comprises internal leads 5 which simultaneously form external leads 2 with their external surfaces. This lead structure 16 of the semiconductor component 1 shown in FIG. 1 enables surface mounting since the underside 19 of the semiconductor component 1 comprises surface-mountable undersides of the external leads 2 and of the chip mounting island 7. The chip mounting island 7 carries a semiconductor chip 9, while the internal leads 5 comprise contact pads 11 which are electrically connected via bonding wires 20 as electrical connections 6 to corresponding contact areas 21 of the top side 22 of the semiconductor chip 9.

The top sides 10 of the chip mounting islands 7 and of the internal leads 5 comprise nanotubes 12 which are arranged orthogonally with respect to the top sides 10 and in the interspaces (13, 14) of which a plastic housing composition 4 is arranged on the internal leads 5, on the one hand, and an adhesive composition 15 is present in the interspaces 14 on the chip mounting island 7, on the other hand. In this case, the nanotubes 12 support the fixing of the adhesive composition 15 on the chip mounting island 7 and the fixing of the semiconductor chip 9 on the adhesive composition 15.

Via the nanotubes 12, on one hand, the adhesive area is enlarged and, on the other hand, the nanotubes 12 serve for anchoring the adhesive composition 15 both on the rear side 23 of the semiconductor chip 9 and on the top side 10 of the chip mounting area 7. In order to bring about an electrical conductivity between the rear side 23 of the semiconductor chip 1 and the chip mounting island 7, the adhesive composition 15 comprises electrically conductive particles. The top sides 10 of the internal leads 5 are also equipped with nanotubes 12, the interspaces 13 between the nanotubes 12 being filled by the plastic housing composition 4. For this purpose, the distance between the nanotubes 12 is chosen with a suitable magnitude in order to ensure that the interspaces (13, 14) between the nanotubes 12 can be completely filled by plastic housing composition 4 or adhesive composition 15.

Such a semiconductor component with the lead structure 16 has the advantage that a delamination between plastic housing composition 4 and internal leads 5 and also between chip mounting island 7 and adhesive composition 15 is practically avoided by virtue of the nanotubes 12 on the surfaces 10 of the internal leads 5 and the chip mounting island 7. The same applies to the boundary layer between the rear side 23 of the semiconductor chip 9 and the adhesive composition 15.

FIGS. 2 to 8 show individual components of production steps for producing a semiconductor component 1 in accordance with FIG. 1.

Figure 2:
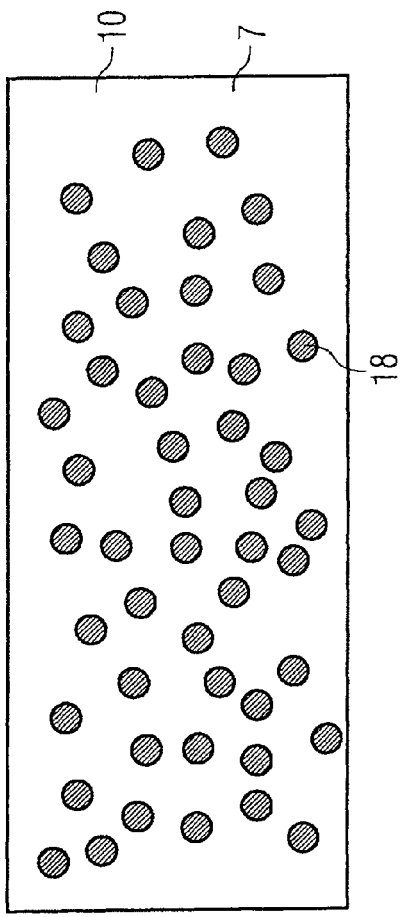
FIG. 2 shows a schematic plan view of a top side of a chip mounting island with nanotube seeds.

FIG. 2 shows a schematic plan view of a top side 10 of a chip mounting island 7 with nanotube seeds 18. The nanotube seeds 18 are optionally fullerenes which are applied together or successively with a catalyst metal layer composed of nickel, iron, molybdenum, cobalt or alloys. In this case, the nanotube seeds 18 are distributed statistically on the top side 10 of the chip island 7.

Figure 3:
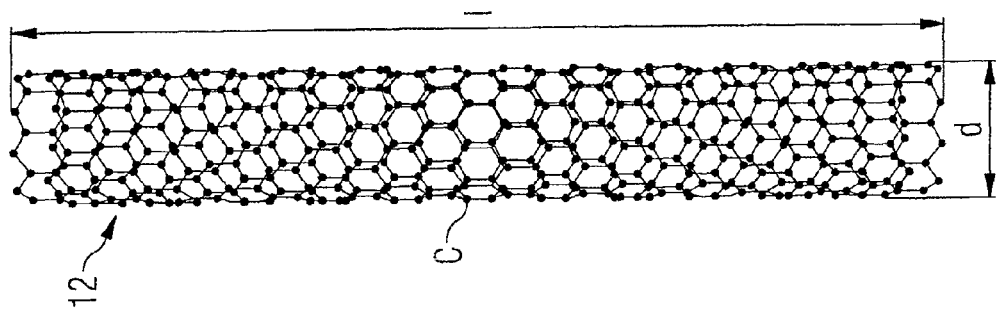
FIG. 3 schematically shows a perspective model of a carbon nanotube.

FIG. 3 schematically shows a perspective model of a carbon nanotube 12. Such nanotubes 12 can be single-layered or multilayered, the multilayered nanotube arising by virtue of nanotubes of different diameters being interleaved in one another. The diameter d of such nanotubes lies between 1.2 nm$\leq$d$\leq$300 nm and the proportion by volume $\Delta V$ of the carbon nanotubes 12 on the lead structure shown in FIG. 4 is 1% by volume$\leq \Delta V \leq$10% by volume.

This means that the interspaces between the nanotubes 12 are large enough to fill them with plastic housing composition with adhesive composition in a manner free of voids. The carbon atoms C of the nanotube shown in FIG. 3 are arranged hexagonally with respect to one another and form so-called Kekülé rings, wherein six carbon atoms C in each case form a ring. These hexagonal rings form a hollow cylinder corresponding to the diameter of the nanotube 12. The length l of such nanotubes lies between 50 nm≦l≦3 mm. However, an average length l of the nanotubes 12, where: 100 nm≦l≦20 µm, may optionally be used for improving the adhesion promoting between internal leads and plastic housing composition or chip mounting island and adhesive layer.

Figure 4:
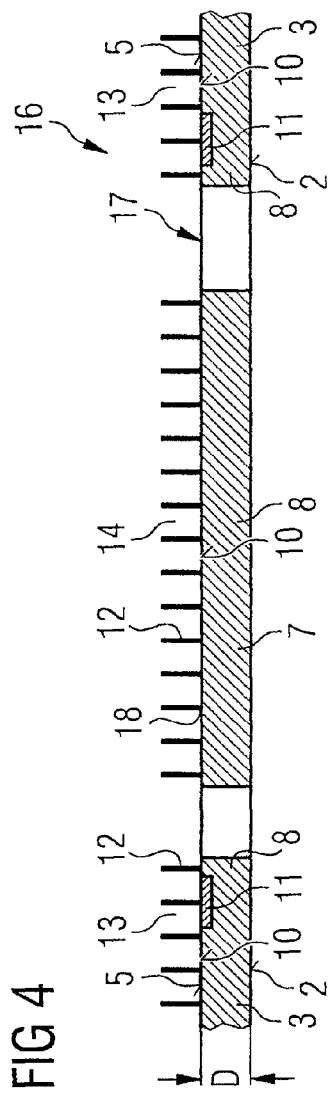
FIG. 4 shows a schematic cross section through a lead structure in accordance with one embodiment after applying or growing nanotubes from the nanotube seeds in accordance with FIG. 2.

FIG. 4 shows a schematic cross section through a lead structure 16 in accordance with one embodiment after applying or growing nanotubes 12 from the nanotube seeds 18 shown in FIG. 2 on the inner top sides 10 of the internal leads 5 and the chip mounting island 7. In this embodiment of a lead structure 16, the lead material 8 has an identical material thickness D both for the chip mounting island 7 and for the internal leads 5.

The lead structure 16 is part of a leadframe 17, only an individual semiconductor component of which is shown in FIG. 4. This semiconductor component position has the chip mounting island 7 in the center and the external connections 3 in the form of external leads 2 at the edges. The equidistant spacing apart of the nanotubes 12 on the top sides 10 of the chip mounting island 7 and the internal lead 5 is only a schematic illustration, especially as the distances and interspaces 14 on the chip mounting island 7 and the interspaces 13 on the internal leads 5 vary.

Figure 5:
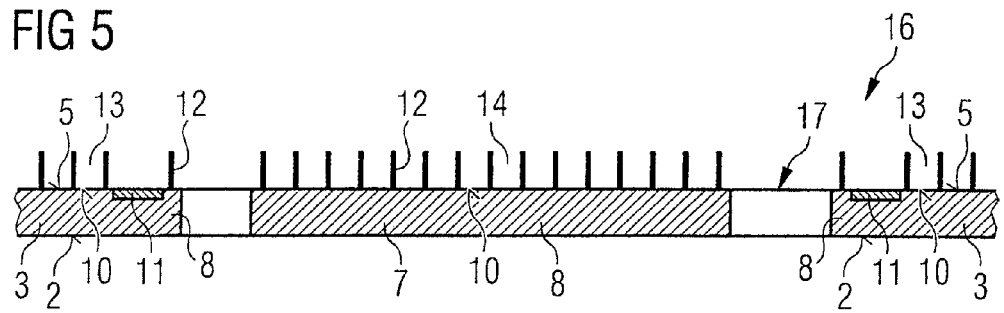
FIG. 5 shows a schematic cross section through a lead structure in accordance with FIG. 4 after uncovering contact pads on the top sides of internal leads.

FIG. 5 shows a schematic cross section through a lead structure 16 in accordance with FIG. 4 after uncovering contact pads 11 on the top sides 10 of the internal leads 5. The internal leads 5 carry such contact pads 11 in order to be able to electrically connect the internal leads 5 and thus also the external leads 2 to corresponding contact areas on the top side of semiconductor chips. In order to ensure a sufficient bondability, therefore, as shown in FIG. 5, these regions of the internal leads 5 are uncovered or kept free of nanotubes 12 and nanotube seeds, the rest of the construction of the lead structure 16 being identical to the structure shown in FIG. 4.

Figure 6:
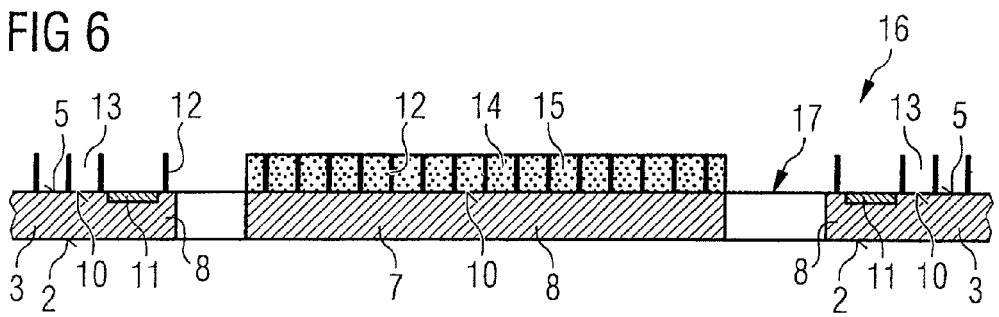
FIG. 6 shows a schematic cross section through the lead structure in accordance with FIG. 5 after applying an adhesive composition.

FIG. 6 shows a schematic cross section through the lead structure 16 in accordance with FIG. 5 after applying an adhesive composition 15. The adhesive composition 15 is applied only in the region of the chip mounting island 7 in order subsequently to fix a semiconductor chip in this region. The selective application of the adhesive composition 15 can be effected by dispensing, the interspaces 14 between the nanotubes 12 being filled with adhesive composition 15. In this case, the application of the adhesive composition 15 can be supported by corresponding capillary action of densely packed nanotubes 12.

Figure 7:
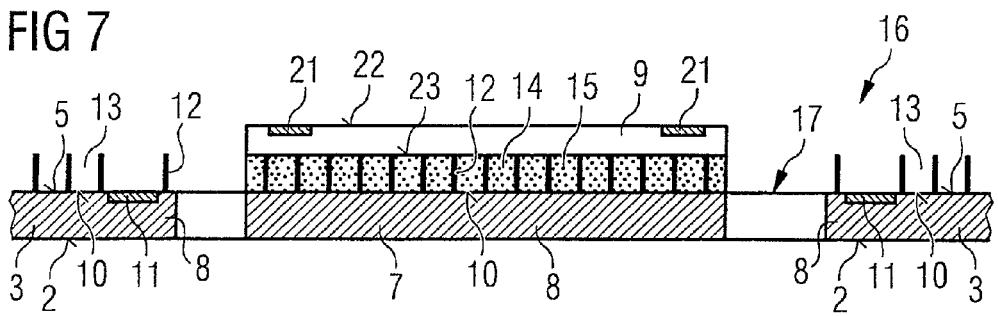
FIG. 7 shows a schematic cross section through the lead structure in accordance with FIG. 6 after applying a semiconductor chip.

FIG. 7 shows a schematic cross section through the lead structure 16 in accordance with FIG. 6 after applying a semiconductor chip 9. The semiconductor chip 9 is applied by its rear side 23 to the adhesive composition 15, which comprises correspondingly conductive particles, such that the rear side 23 of the semiconductor chip 9 is electrically connected to the chip mounting island 7. The top side 22 of the semiconductor chip 9 includes contact areas 21 which are connected to the integrated circuits on the top side 22 of the semiconductor chip 9 and are not yet electrically connected to the contact pads 11 on the internal leads 5 of the lead structure 16. This electrical connection takes place via a subsequent step as shown in the FIG. 8.

Figure 8:
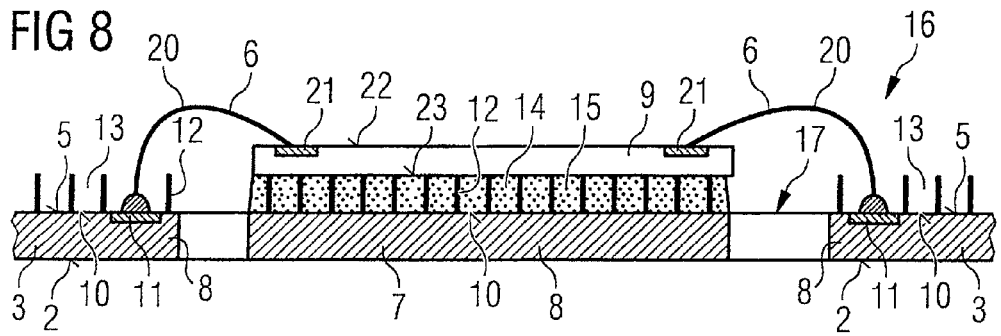
FIG. 8 shows a schematic cross section through the lead structure in accordance with FIG. 7 after producing electrical connections and before embedding the lead structure into a plastic housing composition.

FIG. 8 shows a schematic cross section through the semiconductor structure 16 in accordance with FIG. 7 after producing electrical connections 6 and before embedding the lead structure 16 into a plastic housing composition to form a surface-mountable semiconductor component. After fitting bonding wires 20 with the contact area 21 on the active top side 22 of the semiconductor chip 9 being connected to the contact pads 11 on the internal leads 5, the electrical construction of a semiconductor component in a semiconductor component position of the leadframe is completed, such that all that then remains to be done is dispensing or injection molding of the plastic housing composition, as is shown in FIG. 1, and stamping out of the semiconductor component from the leadframe.

What is claimed is:

1. A lead structure for a semiconductor component, the lead structure comprising:
   a plastic housing composition;
   external leads configured to be externally connected to outside the plastic housing composition;
   internal leads configured to be electrically connected to within the plastic housing composition, the internal leads including contact pads;
   a chip mounting island comprising lead material, the chip mounting island being configured to apply a semiconductor chip; and
   a plurality of nanotubes anchored on top sides of the chip mounting island and the internal leads, the plurality of nanotubes being arranged with interspaces between nanotubes and such that the contact pads of the internal leads are free of nanotubes; and
   an adhesive composition arranged in the interspaces between the nanotubes anchored on the chip mounting island, the adhesive composition filling the interspaces in a manner free of voids;
   wherein the plastic housing composition is arranged in the interspaces between the nanotubes anchored on the internal leads, the plastic housing composition filling the interspaces in a manner free of voids.

2. The lead structure of claim 1, wherein the internal leads, the external leads and the chip mounting island have the same thickness.

3. The lead structure of claim 1, wherein the lead structure is multilayered and comprises:
   a base structure composed of a copper alloy; and
   metal layers of at least one of the metals selected from: nickel, iron, molybdenum, cobalt or alloys thereof, the metal layers being arrange above the base structure.

4. The lead structure of claim 3, further comprising:
   a layer composed of a mixture of carbon nanotubes and polymeric chain molecules, the carbon nanotube and polymeric chain molecule layer being disposed on the base structure.

5. The lead structure of claim 1, further comprising:
   carbon nanotubes arranged on the top sides of the internal leads and the chip mounting island.

6. The lead structure of claim 5, wherein the carbon nanotubes comprise a diameter d, where: 1.2 nm≦d≦300 nm.

7. The lead structure of claim 5, wherein the carbon nanotubes arranged on the lead structure comprise a proportion by volume ΔV, where: 1% by volume≦ΔV≦10% by volume remainder polymeric chain molecules of the plastic housing composition or of the adhesive composition.

8. The lead structure of claim 5, wherein the carbon nanotubes comprise a length l, where: 50 nm≦l≦3 mm.

9. The lead structure of claim 5, wherein the carbon nanotubes of the lead structure comprise a columnar structure oriented virtually orthogonally with respect to surfaces of the top sides of the internal leads and the chip mounting island.

10. A semiconductor component, comprising:
    a semiconductor chip including contact areas; and
    a lead structure, comprising:
       a plastic housing composition;
       external leads configured to be externally connected to outside the plastic housing composition;

internal leads disposed within the plastic housing composition, the internal leads including contact pads electrically connected to the contact areas of the semiconductor chip;

a chip mounting island composed of lead material, the semiconductor chip being arranged on the chip mounting island; and a plurality of nanotubes anchored on top sides of the chip mounting island and the internal leads, the plurality of nanotubes being arranged with interspaces between nanotubes and such that the contact pads of the internal leads are free of nanotubes; and an adhesive composition arranged in the interspaces between the nanotubes arranged on the chip mounting island, the adhesive composition filling the interspaces in a manner free of voids;

wherein the plastic housing composition is arranged in the interspaces between the nanotubes arranged on the internal leads, the plastic housing composition filling the interspaces in a manner free of voids.

* * * * *